United States Patent [19]

Sasaki

[11] Patent Number: 4,646,426
[45] Date of Patent: Mar. 3, 1987

[54] METHOD OF PRODUCING MOS FET TYPE SEMICONDUCTOR DEVICE

[75] Inventor: Nobuo Sasaki, Kawasaki, Japan

[73] Assignee: Fujitsu Limited, Kawasaki, Japan

[21] Appl. No.: 722,741

[22] Filed: Apr. 8, 1985

Related U.S. Application Data

[63] Continuation of Ser. No. 348,424, Feb. 12, 1982, abandoned.

[30] Foreign Application Priority Data

Feb. 16, 1981 [JP] Japan ................................. 56-21296
Feb. 18, 1981 [JP] Japan ................................. 56-22393

[51] Int. Cl.$^4$ ......................................... H01L 21/268
[52] U.S. Cl. .................................. 29/571; 29/576 B;
  29/578; 29/589; 148/1.5; 148/DIG. 90;
  148/DIG. 91; 148/DIG. 141; 357/23.6;
  357/23.9; 357/91; 427/53.1
[58] Field of Search .................... 29/571, 578, 576 B,
  29/589; 148/1.5, DIG. 141, DIG. 91, DIG. 90,
  DIG. 92, DIG. 93; 357/23.6, 23.9, 23 R, 91

[56] References Cited

U.S. PATENT DOCUMENTS

| | | | |
|---|---|---|---|
| 3,514,844 | 6/1970 | Bower | 357/23.9 |
| 3,808,472 | 4/1974 | Engeler | 357/23.6 |
| 4,243,433 | 1/1981 | Gibbons | 148/1.5 |
| 4,270,262 | 6/1981 | Hori | 357/23.6 |
| 4,274,193 | 6/1981 | Angle | 357/23.9 |
| 4,366,613 | 1/1983 | Ogura et al. | 29/571 |
| 4,441,249 | 4/1984 | Alspector et al. | 29/577 C |
| 4,468,855 | 9/1984 | Sasaki | 29/576 B |

OTHER PUBLICATIONS

Iwamatsu et al., "Silicon on Sapphire MOSFETS Fabricated by Back Surface Laser Anneal Technology" Electronics Letters; vol. 15, No. 25, Dec. 6, 1979.
Iwamatsu et al., "Self Aligned Aluminum Gate MOSFET'S Fabricated by Laser Anneal" J. Electrochem Soc., vol. 28, No. 2, Feb. 1981.
Fowler et al.; "Process for Making MOSFET'S", IBM Tech Disc Bull, vol. 13, No. 11, Apr. 1971, p. 3358.
Esnault et al., "Self Aligned IGFET" IBM Tech Disc Bull, vol. 16, No. 5, Oct. 1973, pp. 1498-1499.
Lever, "Background Heating for Laser Annealing" IBM Tech Disc Bull, vol. 21, No. 10, Mar. 1979, p. 4040.

*Primary Examiner*—Aaron Weisstuch
*Attorney, Agent, or Firm*—Staas & Halsey

[57] ABSTRACT

In the production of an MOS transistor or a one-MOS transistor one-capacitor memory cell, a gate electrode is made of aluminum, doped regions are formed by an ion-implantation method using the gate electrode as a mask, and the doped regions are annealed by a laser beam.

4 Claims, 8 Drawing Figures

METHOD OF PRODUCING MOS FET TYPE SEMICONDUCTOR DEVICE

This is a continuation of co-pending application Ser. No. 348,242 filed on Feb. 12, 1982 and now abandoned.

BACKGROUND OF THE INVENTION

(1) Field of the Invention

The present invention relates to semiconductor devices, more particularly, to a method of producing a metal oxide semiconductor field effect transistor (MOS FET). Furthermore, the present invention is applied to the formation of a semiconductor memory device comprising an MOS transistor and a capacitor (i.e., a so-called "one-transistor one-capacitor memory cell").

(2) Description of the Prior Art

A gate electrode of an MOS transistor is often made of polycrystalline silicon. In this case, a thin gate insulating layer (e.g., a silicon dioxide layer) is formed on a semiconductor substrate (e.g., a silicon wafer), then a polycrystalline silicon layer is formed on the gate insulating layer by a chemical vapor deposition (CVD) method. A photoresist layer is formed on the polycrystalline silicon layer, exposed through a photomask, and developed. The polycrystalline silicon layer and the gate insulating layer are selectively etched, using the photoresist layer as a mask, to form the polycrystalline silicon gate electrode. Impurities (e.g., boron, phosphorus) are then introduced to form heavily doped regions (i.e., a source region and a drain region) having a conductivity type which is opposite that of the semiconductor substrate. Namely, the source and drain regions are self-aligned to the gate electrode. Therefore, it is possible to produce a high density device (i.e., to increase the degree of integration of elements). In the case where the impurities are introduced by an ion-implantation method, it is necessary to anneal the doped regions (i.e., the source and drain regions) at an elevated temperature for activation of the introduced impurities and for repairing the crystalline damage. In another case, where the impurities are introduced by a thermal diffusion method, the semiconductor substrate is heated to an elevated temperature during the diffusion of impurities. Such an elevated temperature does not affect the polycrystalline silicon gate. Furthermore, it is possible to form easily an insulating layer covering the polycrystalline silicon gate by thermally oxidizing the polycrystalline silicon gate.

An MOS transistor having a polycrystalline silicon gate can, for example, be utilized to form a one-transistor one-capacitor memory cell (see V. Leo Rideout, One-Device Cells for Dynamic Random-Access Memories, IEEE Transactions on Electron Devices, Vol. ED-26, No. 6, PP. 839-852, June 1979). FIG. 1 illustrates one example of the various structures of one-transistor one-capacitor memory cells. The memory device of FIG. 1 comprises a p-type silicon semiconductor substrate 1, a field insulating layer (e.g., a thick silicon dioxide layer) 2, a gate insulating layer (e.g. a thin silicon dioxide layer) 3, a polycrystalline silicon gate electrode 4, $n^+$-type doped regions 5a and 5b which are formed by introducing n-type impurities into the semiconductor substrate 1 in a self-aligned manner using the gate electrode 4 as a mask, an insulating layer 6 (e.g., a silicon dioxide layer formed by thermally oxidizing the polycrystalline silicon gate electrode 4), a polycrystalline silicon capacitor plate 7, a phosphosilicate glass (PSG) insulating layer 8, and a conductive line 9 (e.g., of aluminum). The polycrystalline silicon gate electrode 4 serves as a word line, and the conductive line 9 serves as a bit line. The capacitor plate 7 is connected to a power source line ($V_{DD}$).

The heavily-doped polycrystalline silicon of the gate electrode has a resistivity of $1-2\times 10^{-3}$ $\Omega$cm (ohm centimeter), so that the increase in switching speed of the MOS transistor is limited. If the gate electrode is made of aluminum having a resistivity of $1-2\times 10^{-6}$ $\Omega$cm, the switching speed can be increased. However, since the melting point of aluminum is 629° C. and aluminum alloys with silicon at around 500° C., a semiconductor device having an aluminum layer should not be heated to a temperature of more than about 500° C. Therefore, in the fabrication of aluminum gate MOS transistors, aluminum gate electrodes are usually formed after the formation of source and drain regions. In this case, source and drain regions are not self-aligned to the gate electrode and the mask-to-mask misregistration tolerance should be taken into consideration. Accordingly, one cannot sufficiently increase the density of the semiconductor device.

SUMMARY OF THE INVENTION

An object of the present invention is to make a gate electrode of an MOS transistor of aluminum, to form self-aligned doped regions (i.e., a source region and a drain region), and to anneal the doped regions.

Another object of the present invention is to provide a method of producing an MOS transistor having a high switching speed and a high density.

A further object of the present invention is to provide a method of producing a memory device comprising the above-mentioned MOS transistor and a capacitor.

These and other objects of the present invention are attained by a method of producing a semiconductor device comprising an MOS transistor and, if necessary, a capacitor, comprising the steps of: forming a gate electrode on a gate insulating layer lying on a semiconductor substrate; introducing impurities into the semiconductor substrate by an ion-implantation method to form at least one doped region; and annealing the doped region; wherein the gate electrode is made of aluminum and the annealing step is carried out by irradiation of a laser beam.

BRIEF DESCRIPTION OF THE DRAWING

The present invention will become more apparent from the detailed description of the preferred embodiments, set forth below, with reference to the accompanying drawings, wherein.

DESCRIPTION OF THE PREFERRED EMBODIMENTS

Embodiment 1

An n-channel MOS transistor is produced in accordance with the method of the present invention in the following manner.

A p-type silicon semiconductor substrate 11 (FIG. 2) is selectively oxidized by a conventional thermal oxidation method using a silicon nitride layer mask (not shown) to form a field insulating layer 12 of silicon dioxide. The thickness of the field insulating layer 12 is, for example, approximately 800 nm.

After the removal of the mask, the silicon substrate 11 is oxidized by the conventional thermal oxidation method to form a gate insulating layer 13 (FIG. 2) of silicon dioxide. The thickness of the gate insulating layer 13 is, for example, approximately 40 nm.

Figure 2:
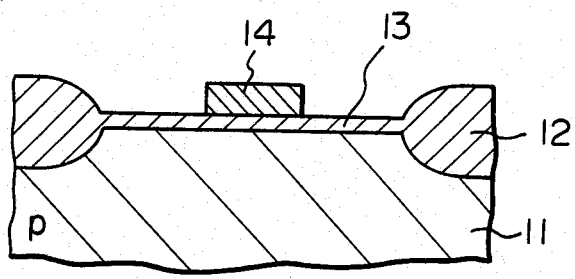
FIGS. 2 and 3 are schematic cross-sectional views of an MOS transistor in various stages of its production by a method in accordance with the present invention.

Then, an aluminum layer having a thickness of, for example, 500 nm is formed on the gate insulating layer 13 and on the field insulating layer 12 by a conventional vapor deposition method. The aluminum layer is selectively removed by a photoetching method to form a gate electrode 14 (FIG. 2).

Figure 3:
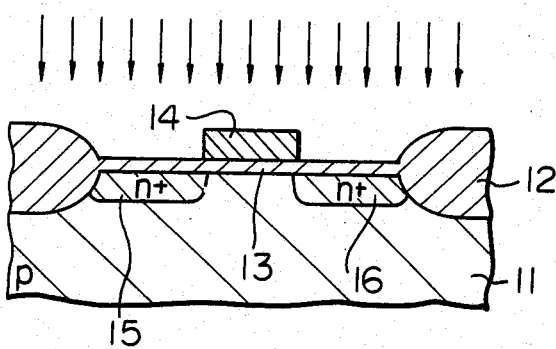

Donor (n-type) impurities (e.g., arsenic, phosphorus) are introduced into the silicon substrate 11 through the gate insulating layer 13 by a conventional ion-implantation method to form n+-type doped regions (i.e., a drain region and a source region) 15 and 16, as illustrated in FIG. 3. For example, arsenic ions are implanted at an implant energy of 150 KeV with a dose of $4 \times 10^{15}$ cm$^{-2}$. Alternatively, it is possible to directly introduce the impurities into the silicon substrate after the gate insulating layer 13 is selectively removed by an etching method using the gate electrode as a mask. The field insulating layer 12 and the aluminum gate electrode 14 do not permit passage of the impurities through them, that is they serve as masks.

A laser beam is irradiated on the obtained device to anneal the n+-type doped regions 15 and 16. That is, laser annealing is carried out. In this case, since the reflectance of aluminum is extremely high, the aluminum gate electrode 14 absorbs only a part of the laser beam and the gate electrode 14 is not heated to an elevated temperature. On the other hand, the n+-type doped regions 15 and 16 absorb the laser beam to the extent that they anneal themselves.

Figure 4:
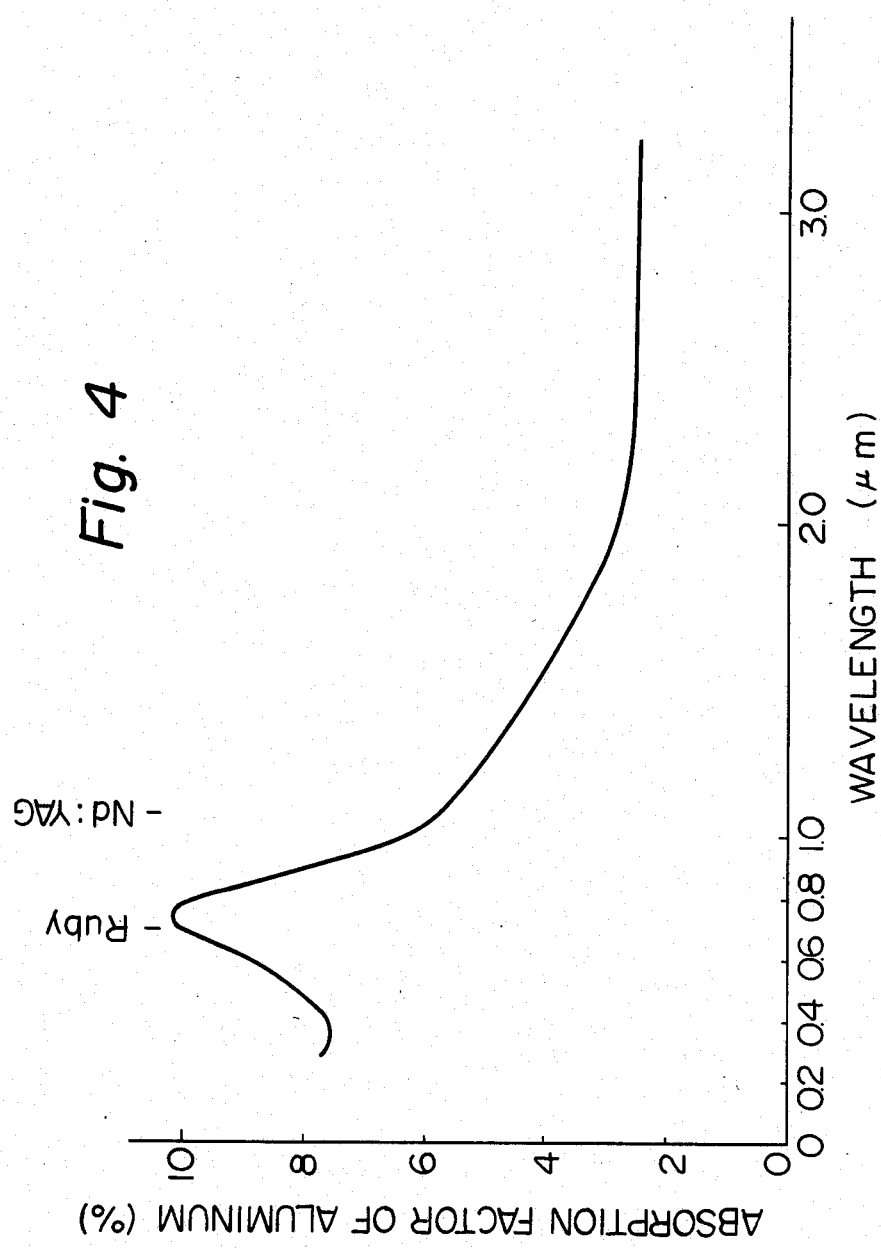
FIG. 4 is a graph of the absorption factor of aluminum.

It is preferable to use a laser beam having a wavelength of 0.9 μm or more, taking the absorption factor of aluminum into consideration. The absorption curve of aluminum is indicated with a solid line in FIG. 4. Of course, a laser which does not significantly heat aluminum should be used for the laser annealing. For example, if one were to use a ruby laser having a wavelength of 0.6943 μm and irradiate at an energy density of 1.16 J/cm², the sheet resistance of the n+-type doped regions 15 and 16 would reduce to only 300 ohms/square (Ω/□). This sheet resistance value would be too large. If one were to use this ruby laser at an irradiation energy density of 2 J/cm², the sheet resistance would be reduced to 30 ohms/square; however, a network of cracks would be formed at the surface of the aluminum gate electrode 14. By using an Nd:YAG laser having a wavelength of 1.06 μm and irradiating at an energy density of 2 J/cm², on the other hand, the sheet resistance of the doped regions can be reduced to 30 ohms/square without the formation of cracks in the aluminum gate electrode.

Incidentally, by heating silicon to a temperature of 300° C., one can increase its absorption factor for the Nd:YAG laser to approximately six times as large as that at room temperature. Therefore, in the case of an Nd:YAG laser, it is possible to heat the silicon substrate to a temperature of from 200° C. to 300° C. for irradiation with the laser beam to increase the efficiency of the laser annealing. The sheet resistance can be reduced to 20 ohms/square.

As a laser having a wavelength of 0.9 μm or more, there are Nd:YAG lasers, $CO_2$ lasers etc.

It is preferable to form an antireflection coating on only the doped regions. For example, if a silicon dioxide layer having a thickness of 180 nm is formed on the doped region of the silicon substrate as an antireflection coating for the Nd:YAG laser, the intensity of the absorbed beam in the silicon is 95% of the intensity of irradiation of the laser beam. In this case, the efficiency of the laser annealing is also increased and the sheet resistance of the doped region is reduced to 20 ohms/square.

Figure 5:
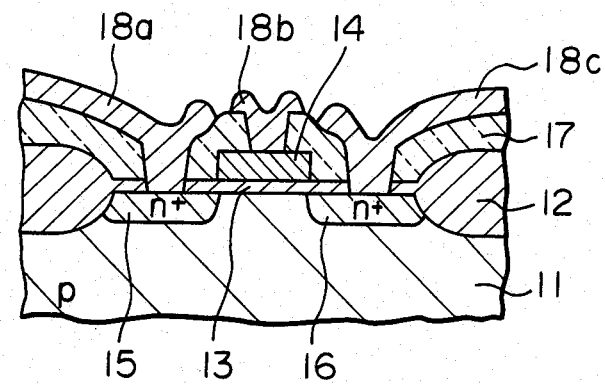
FIGS. 5 through 7 are schematic cross-sectional views of a one-transistor one-capacitor memory cell in various stages of its production by a method in accordance with the present invention.

After the laser annealing, an insulating layer 17 of, for example, phosphosilicate glass (PSG) is formed by a conventional chemical vapor deposition (CVD) method, as illustrated in FIG. 5. The insulating layer 17 and the gate insulating layer 13 are selectively etched by a photoetching method to form contact holes on the $n^{30}$-type doped regions 15 and 16 and on the gate electrode 14. Then a conductive layer of, for example, aluminum is formed on the insulating layer 17 by a vapor deposition method and is patterned by a photoetching method to form interconnection lines for drain, gate, and source 18a, 18b, and 18c. Thus, an N channel type MOS transistor is produced.

Embodiment 2

Figure 1:
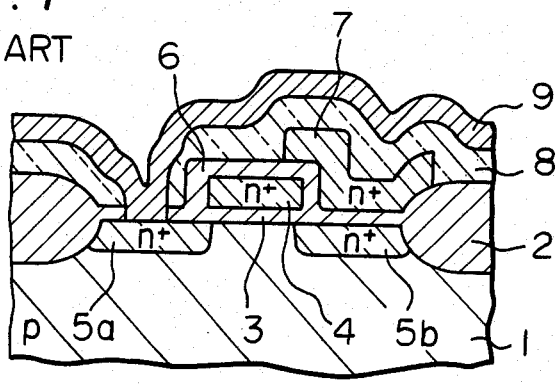
FIG. 1 is a schematic cross-sectional view of a one-transistor one-capacitor memory cell according to the prior art.

A semiconductor memory cell comprising an MOS transistor and a capacitor and having a similar structure to that illustrated in FIG. 1 is produced in accordance with the method of the present invention in the following manner.

Figure 6:
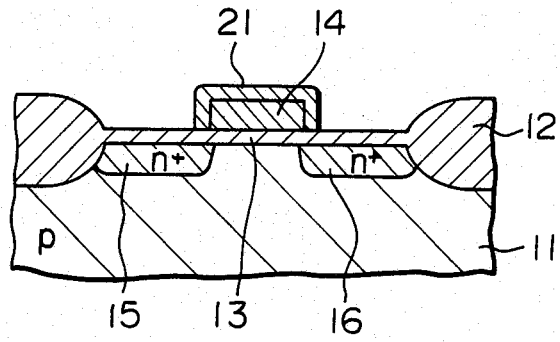

After the laser annealing for the n+-type doped regions 15 and 16 (FIG. 3) in the above-mentioned embodiment 1, the aluminum gate electrode (i.e., a word line) 14 is oxidized at a temperature of up to 500° C. to form an aluminum oxide ($Al_2O_3$) layer 21 having a thickness of, for example, approximately 100 nm, as illustrated in FIG. 6. The aluminum oxide layer 21 serves as a good insulator and is formed by a plasma oxidation method, a wet anodizing method, a DC plasma anodization method, or dipping in warm water having a temperature of approximately 60° C.

Then, another aluminum layer having a thickness of, for example, 500 nm is formed on the aluminum oxide layer 21, the gate insulating layer 13, and the field insulating layer 12 by a vapor deposition method. The aluminum layer is selectively removed by a photoetching method to form a capacitor plate 22, as illustrated in FIG. 7.

An insulating layer 23 (FIG. 7) of, for example, PSG is formed by a CVD method on the entire surface of the obtained device. The thickness of the insulating layer 23 is, for example, 500 nm. The insulating layer 23 and the gate insulating layer 13 are selectively etched by a photoetching method to form a contact hole on the n+-type doped region 15.

Figure 7:
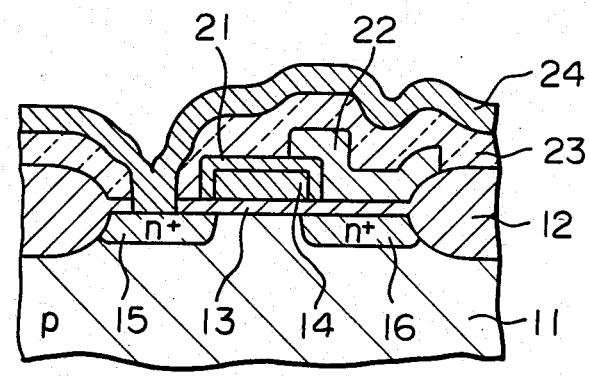

Then, a conductive layer of, for example, aluminum is formed on the insulating layer 23 by a vapor deposition method and is patterned by a photoetching method to form a conductive line 24 (i.e., a bit line) contacting the n+-type doped region 15 through the contact hole, as illustrated in FIG. 7.

The resultant one-transistor one-capacitor memory cell has a bit line and word line made of aluminum, so the switching speed of the memory cell is high. Furthermore, the doped regions (i.e., the drain and source regions of the MOS transistor) are formed in a self-aligned manner, so the area of the memory cell is small, namely, the density of a dynamic random access memory (RAM) integrated circuit comprising a large number of the memory cells is high.

Embodiment 3

Figure 8:
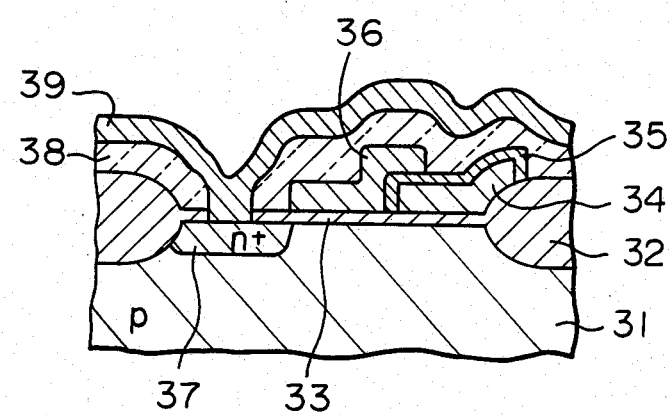
FIG. 8 is a schematic cross-sectional view of another type of a one-transistor one-capacitor memory cell produced by a method in accordance with the present invention.

Another type of semiconductor memory cell, comprising an MOS transistor and a capacitor, is illustrated in FIG. 8 and is produced in accordance with the method of the present invention in the following manner.

A p-type silicon semiconductor substrate 31 is selectively oxidized by a thermal oxidation method to form a field insulating (silicon dioxide) layer 32. Then, the portion of the silicon substrate which is not covered with the field oxide layer 32 is thermally oxidized to form a gate insulating (silicon dioxide) layer 33 in the same manner as in Embodiment 1.

An aluminum layer is formed on the oxide layer 32 and the gate oxide layer 33 by a vapor deposition method and is selectively etched by a phtoetching method to form a capacitor plate 34. The aluminum capacitor plate 34 is oxidized by, for example, a plasma oxidation method to form an aluminum oxide layer 35 thereon. It is possible to make the capacitor plate of polycrystalline silicon instead of aluminum.

Another aluminum layer is then formed on the entire surface of the obtained memory cell by a vapor deposition method and is selectively etched by a photoetching method to form a gate electrode 36 (i.e., a word line).

Donor impurities (e.g., arsenic) are selectively introduced into the silicon substrate 31 through the gate oxide layer 33 by an ion-implantation method to form a doped region 37. In this case, the field oxide layer 32, the capacitor plate 34, and the gate electrode 36 serve as masks preventing the impurities from passing therethrough. Thus, the n+-type doped region 37 is self-aligned to the gate electrode 36. The laser annealing for the n+-type doped region 37 is carried out by irradiation of a laser beam in the same manner as that of Embodiment 1.

An insulating layer 38 of PSG then is formed on the entire surface of the obtained memory cell by a CVD method. The insulating layer 38 and the gate oxide layer 33 are selectively etched by a photoetching method to form a contact hole on the doped region. Finally, an aluminum layer is formed on the insulating layer 38 by a vapor deposition method and is patterned by a photoetching method to form a conductor line 39 (i.e., a bit line) connecting to the n+-type doped region 37 through the contact hole, as illustrated in FIG. 8. The resultant memory cell does not have a doped region under the capacitor plate 34, but an inversion layer occurs in the silicon substrate 31 under the capacitor plate 34 if an appropriate bias is applied to the capacitor plate 34.

It will be obvious that the present invention is not restricted to the above-mentioned embodiemnt and that many variations are possible for a person skilled in the art without departing from the scope of the present invention. For example, it is possible to exchange the conductivity type of the silicon substrate and doped regions from p-type to n-type or from n-type to p-type.

I claim:

1. A method of producing a semiconductor memory device including one metal oxide semiconductor transistor and one capacitor formed on a semiconductor substrate, comprising the steps of:
   (a) forming a gate insulating layer on the semiconductor substrate;
   (b) forming an aluminum gate electrode on the gate insulating layer;
   (c) introducing impurities into the semiconductor substrate to form doped regions by ion-implanting the impurities using the aluminum gate as a mask;
   (d) annealing the doped regions by heating the semiconductor substrate to a temperature of from 200° C. to 300° C. and irradiating the semiconductor substrate with a laser beam having a wavelength of 0.9 μm or more;
   (e) oxidizing the aluminum gate electrode to form an aluminum oxide layer thereon;
   (f) forming an aluminum capacitor plate on the gate insulating layer and the aluminum oxide layer;
   (g) forming an intermediate insulating layer on the entire surface of said device;
   (h) opening windows through the gate insulating layer and the intermediate insulating layer to form contact holes; and
   (i) forming a patterned layer of aluminum on the intermediate insulating layer.

2. A method according to claim 1, wherein said step (d) comprises irradiating a laser beam having an energy density of substantially 2 J/cm$^2$.

3. A method of producing a semiconductor memory device, including one metal oxide semiconductor transistor and one capacitor formed on a semiconductor substrate, comprising the steps of:
   (a) forming a gate insulating layer on the semiconductor substrate;
   (b) forming an aluminum capacitor plate on the gate insulating layer;
   (c) oxidizing the capacitor plate to form an aluminum oxide layer thereon;
   (d) forming an aluminum gate electrode on the gate insulating layer and on the aluminum oxide layer;
   (e) introducing impurities into the semiconductor substrate to form a doped region by ion-implantation using the aluminum gate electrode as a mask;
   (f) annealing the doped region by heating the semiconductor substrate to a temperature of from 200° C. to 300° C. and irradiating the semiconductor substrate with a laser beam having a wavelength of 0.9 μm or more;
   (g) forming an intermediate insulating layer on the entire surface of said device;
   (h) opening windows through both the gate insulating layer and the intermediate insulating layer to form contact holes; and
   (i) forming a patterned layer of aluminum on the intermediate insulating layer.

4. A method according to claim 3, wherein said step (f) comprises irradiating a laser beam having an energy density of substantially 2 J/cm$^2$.

* * * * *

UNITED STATES PATENT AND TRADEMARK OFFICE
CERTIFICATE OF CORRECTION

PATENT NO. : 4,646,426
DATED : MARCH 3, 1987
INVENTOR(S) : NOBUO SASAKI

It is certified that error appears in the above-identified patent and that said Letters Patent is hereby corrected as shown below:

Col. 4, line 10, "The" should be --Thus, the--;
line 30, "$n^{30}$-type" should be --$n^+$-type--.

Col. 6, line 2, "embodiemnt" should be --embodiment--.

Signed and Sealed this

Eighteenth Day of August, 1987

*Attest:*

DONALD J. QUIGG

*Attesting Officer*   *Commissioner of Patents and Trademarks*